US012696012B2

(12) United States Patent　　(10) Patent No.: US 12,696,012 B2
Ramakrishnan　　(45) Date of Patent: Jul. 28, 2026

(54) IMAGE SENSORS WITH LOW NOISE READOUT

(71) Applicant: SEMICONDUCTOR COMPONENTS INDUSTRIES, LLC, Scottsdale, AZ (US)

(72) Inventor: Shankar Ramakrishnan, Bangalore (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 81 days.

(21) Appl. No.: 18/956,771

(22) Filed: Nov. 22, 2024

(65) Prior Publication Data

US 2026/0149897 A1　May 28, 2026

(51) Int. Cl.
| | |
|---|---|
| *H04N 25/78* | (2023.01) |
| *H03M 1/56* | (2006.01) |
| *H03M 1/72* | (2006.01) |
| *H04N 25/60* | (2023.01) |
| *H04N 25/77* | (2023.01) |

(52) U.S. Cl.
CPC .............. *H04N 25/78* (2023.01); *H03M 1/72* (2013.01); *H04N 25/60* (2023.01); *H04N 25/77* (2023.01)

(58) Field of Classification Search
CPC ........ H04N 25/60; H04N 25/77; H04N 25/78; H03M 1/56; H03M 1/72; H03M 1/462; H03M 1/1009
See application file for complete search history.

(56) References Cited

U.S. PATENT DOCUMENTS

| | | | |
|---|---|---|---|
| 5,982,313 | A | 11/1999 | Brooks |
| 7,719,595 | B1 | 5/2010 | Johnson |
| 8,605,173 | B2 | 12/2013 | Lee |
| 8,648,913 | B2 | 2/2014 | Deng |
| 9,893,740 | B1 | 2/2018 | Ramakrishnan |

(Continued)

FOREIGN PATENT DOCUMENTS

| | | |
|---|---|---|
| CN | 114553230 A | 5/2022 |
| DE | 102008025367 B4 | 9/2015 |

(Continued)

OTHER PUBLICATIONS

Chai, Yun ; Wu, Jieh-Tsorng: A 5.37mW 10b 200MS/s dual-path pipelined ADC: In: 2012 IEEE international solid-state circuits conference ISSCC, Feb. 19-23, 2012, San Francisco, CA, USA. Piscataway, NJ : IEEE, 2012. S. 462-463. ISBN 978-1-4673-0376-7.

*Primary Examiner* — Marly S Camargo

(74) *Attorney, Agent, or Firm* — Slayden Grubert Beard PLLC

(57) ABSTRACT

Imaging circuitry is provided that includes a column of image pixels coupled to a pixel output line, a first data converter circuit having an input coupled to the pixel output line and configured to output a first set of bits, an integrator having an input coupled to the first data converter, and a second data converter circuit having an input coupled to the integrator and configured to output a second set of bits. The first data converter circuit can be a successive-approximation-register analog-to-digital converter. The integrator can include an amplifier for charging up an integration capacitor. The second set of bits can be scaled based on a calibrated value prior to being combined with the first set of bits.

20 Claims, 8 Drawing Sheets

(56)    References Cited

U.S. PATENT DOCUMENTS

| | | | | |
|---|---|---|---|---|
| 10,797,716 | B1 * | 10/2020 | Ramakrishnan | H04N 25/78 |
| 10,826,933 | B1 * | 11/2020 | Ghosh | H03M 1/468 |
| 11,736,109 | B2 * | 8/2023 | Wang | H03M 1/38 |
| 11,757,461 | B2 | 9/2023 | Shen et al. | |
| 2008/0042890 | A1 | 2/2008 | Cho | |
| 2009/0128385 | A1 | 5/2009 | Joshi | |
| 2013/0002467 | A1 * | 1/2013 | Wang | H03M 1/145 |
| | | | | 341/172 |
| 2018/0183449 | A1 | 6/2018 | Kinyua | |
| 2019/0260384 | A1 * | 8/2019 | Liobe | H04N 25/78 |
| 2020/0412373 | A1 | 12/2020 | Kinyua | |
| 2023/0134892 | A1 * | 5/2023 | Segovia | H04N 25/51 |
| 2025/0038757 | A1 * | 1/2025 | Kijima | H03M 1/462 |
| 2025/0055469 | A1 * | 2/2025 | Lee | H03M 1/245 |

FOREIGN PATENT DOCUMENTS

| | | | |
|---|---|---|---|
| DE | 112012002713 | B4 | 10/2022 |
| EP | 2180599 | A1 | 4/2010 |
| EP | 3748860 | A1 | 12/2020 |
| EP | 4178197 | A1 | 5/2023 |
| WO | 02082461 | A2 | 10/2002 |

* cited by examiner

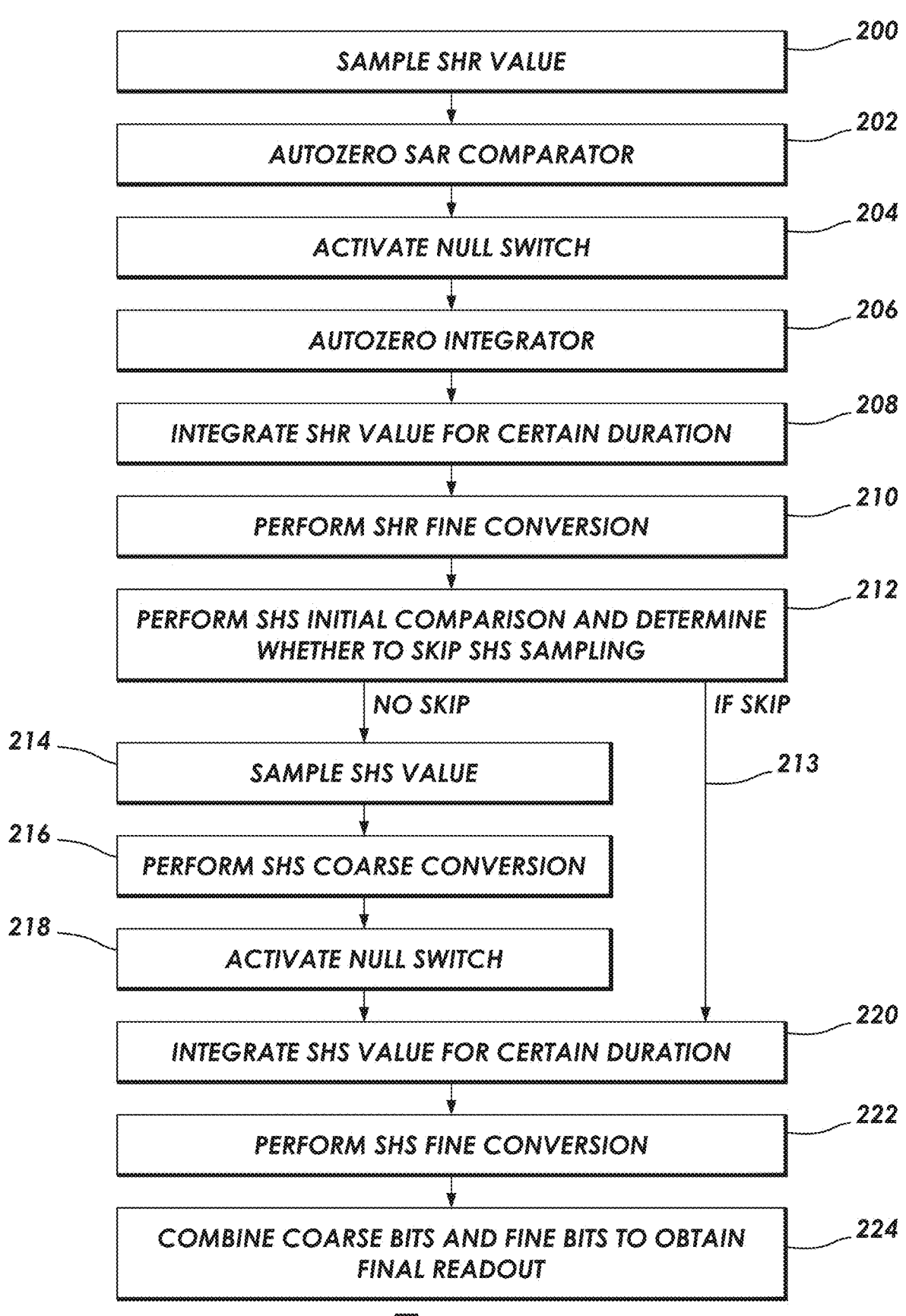

SAMPLE SHR VALUE — 200

AUTOZERO SAR COMPARATOR — 202

ACTIVATE NULL SWITCH — 204

AUTOZERO INTEGRATOR — 206

INTEGRATE SHR VALUE FOR CERTAIN DURATION — 208

PERFORM SHR FINE CONVERSION — 210

PERFORM SHS INITIAL COMPARISON AND DETERMINE WHETHER TO SKIP SHS SAMPLING — 212

NO SKIP          IF SKIP

214 — SAMPLE SHS VALUE

216 — PERFORM SHS COARSE CONVERSION

218 — ACTIVATE NULL SWITCH

213

INTEGRATE SHS VALUE FOR CERTAIN DURATION — 220

PERFORM SHS FINE CONVERSION — 222

COMBINE COARSE BITS AND FINE BITS TO OBTAIN FINAL READOUT — 224

FIG. 5

IMAGE SENSORS WITH LOW NOISE READOUT

BACKGROUND

Image sensors are commonly used in electronic devices such as cellular telephones, cameras, vehicles, and computers to capture images. In a typical arrangement, an image sensor includes an array of image pixels arranged in pixel rows and pixel columns. Circuitry may be coupled to each pixel column for reading out image signals from the image pixels.

It can be challenging to design pixel readout circuitry with low noise performance. It is within this context that the embodiments described herein arise.

BRIEF DESCRIPTION OF THE DRAWINGS

FIG. 5 is a flowchart of illustrative steps for operating data converter circuitry of the type shown in FIG. 4 in accordance with some embodiments.

DETAILED DESCRIPTION

Embodiments of the present technology relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, motor vehicles, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
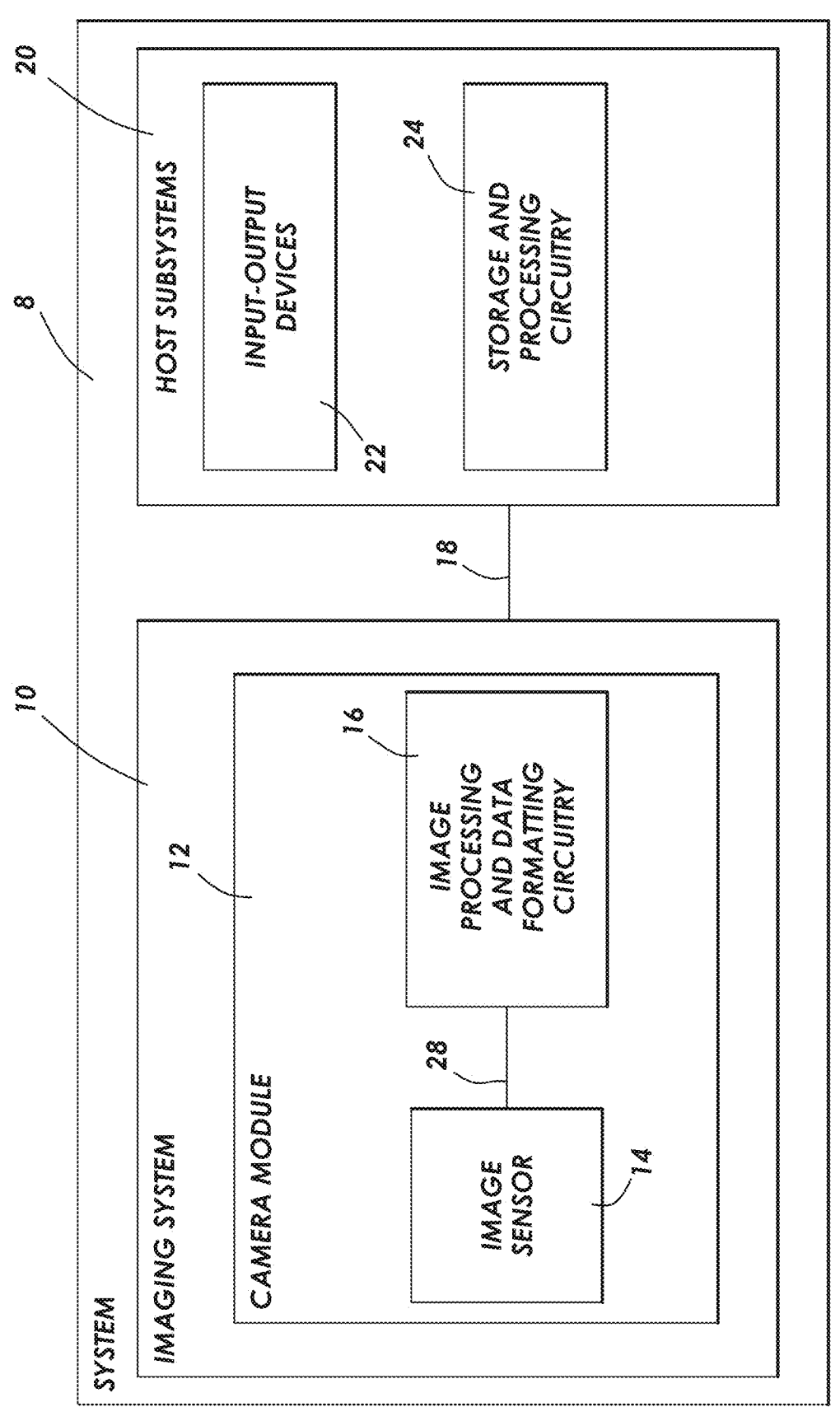
FIG. 1 is a diagram of an illustrative electronic device having an image sensor in accordance with some embodiments.

FIG. 1 is a diagram of an illustrative imaging and response system including an imaging system that uses an image sensor to capture images. System 8 of FIG. 1 may be an electronic device such as a camera, a cellular telephone, a video camera, or other electronic device that captures digital image data, may be a vehicle safety system (e.g., an active braking system or other vehicle safety system), may be a surveillance system, or part of an automated self-driving system.

As shown in FIG. 1, system 8 may include an imaging system such as imaging system 10 and host subsystems such as host subsystem 20. Imaging system 10 may include camera module 12. Camera module 12 may include one or more image sensors 14, such as in an image sensor array integrated circuit, and one or more lenses.

During image capture operations, each lens may focus light onto an associated image sensor 14. Image sensor 14 may include photosensitive elements (i.e., image sensor pixels) that convert the light into analog data. Image sensors may have any number of pixels (e.g., hundreds, thousands, millions, or more). A typical image sensor may, for example, have millions of pixels (e.g., megapixels).

Each image sensor in camera module 12 may be identical or there may be different types of image sensors in a given image sensor array integrated circuit. In some examples, image sensor 14 may further include bias circuitry (e.g., source follower load circuits), sample and hold circuitry, correlated double sampling (CDS) circuitry, amplifier circuitry, data output circuitry, memory (e.g., buffer circuitry), and/or address circuitry.

Still and video image data from sensor 14 may be provided to image processing and data formatting circuitry 16 via path 28. Image processing and data formatting circuitry 16 may be used to perform image processing functions such as data formatting, adjusting white balance and exposure, implementing video image stabilization, and/or face detection. Image processing and data formatting circuitry 16 may additionally or alternatively be used to compress raw camera image files if desired (e.g., to Joint Photographic Experts Group or JPEG format).

In one example arrangement, such as a system on chip (SoC) arrangement, sensor 14 and image processing and data formatting circuitry 16 are implemented on a common semiconductor substrate (e.g., a common silicon image sensor integrated circuit die). If desired, sensor 14 and image processing circuitry 16 may be formed on separate semiconductor substrates. For example, sensor 14 and image processing circuitry 16 may be formed on separate substrates that have been stacked.

Imaging system 10 may convey acquired image data to host subsystem 20 over path 18. Host subsystem 20 may include input-output devices 22 and storage processing circuitry 24. Host subsystem 20 may include processing software for detecting objects in images, detecting motion of objects between image frames, determining distances to objects in images, or filtering or otherwise processing images provided by imaging system 10. For example, image processing and data formatting circuitry 16 of the imaging system 10 may communicate the acquired image data to storage and processing circuitry 24 of the host subsystems 20.

If desired, system 8 may provide a user with numerous high-level functions. In a computer or cellular telephone, for example, a user may be provided with the ability to run user applications. For these functions, input-output devices 22 of host subsystem 20 may include keypads, input-output ports, buttons, and displays and storage and processing circuitry 24. Storage and processing circuitry 24 of host subsystem 20 may include volatile and/or nonvolatile memory (e.g., random-access memory, flash memory, hard drives, solid-state drives, etc.). Storage and processing circuitry 24 may additionally or alternatively include microprocessors, microcontrollers, digital signal processors, and/or application specific integrated circuits.

Figure 2:
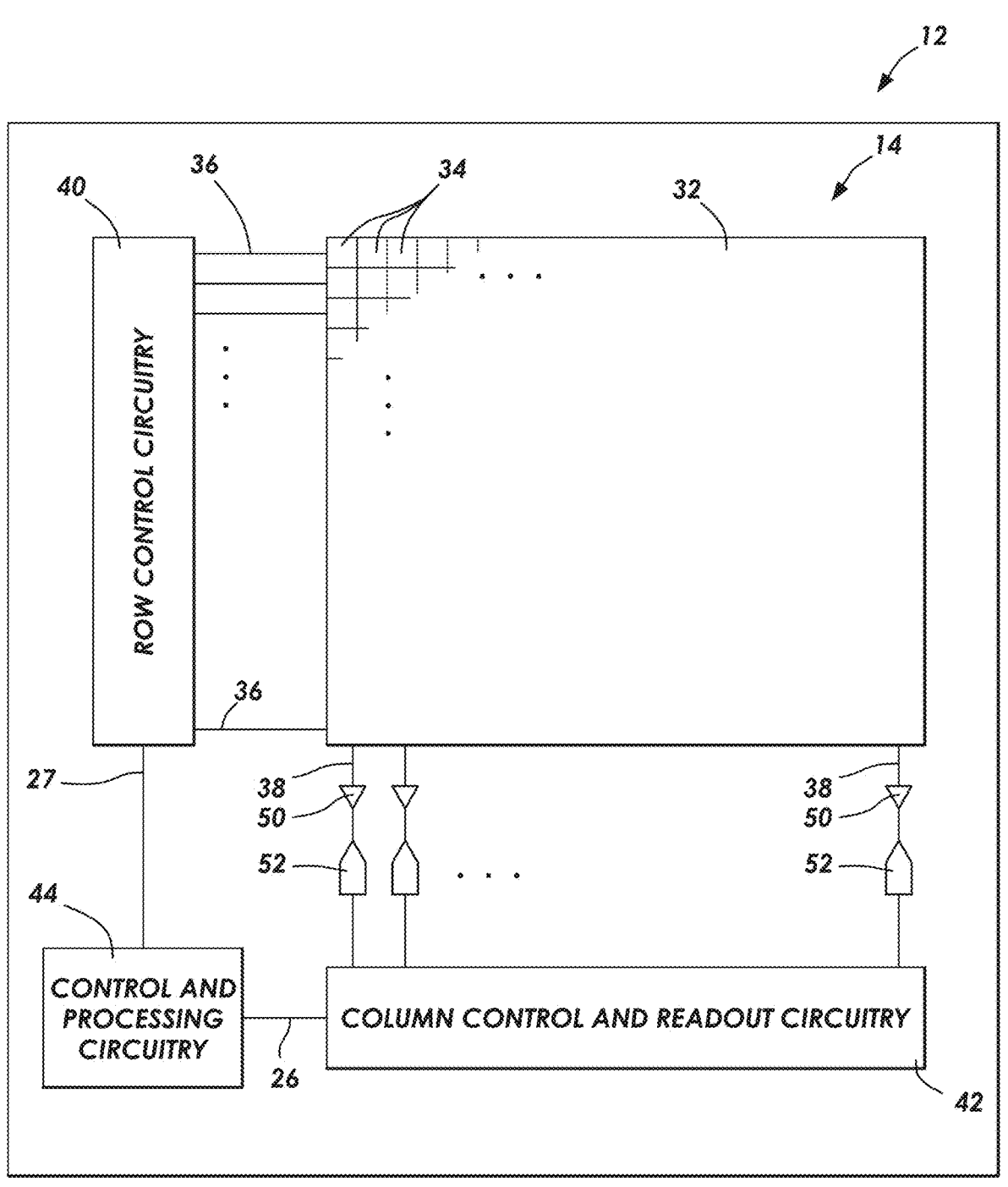
FIG. 2 is a diagram of an illustrative pixel array and associated row and column control circuitry for reading out image signals from an image sensor in accordance with some embodiments.

An example of an arrangement of image sensor 14 of FIG. 1 is shown in FIG. 2. As shown in FIG. 2, image sensor 14 may include control and processing circuitry 44. Control and processing circuitry 44 (sometimes referred to as control and processing logic) may be part of image processing and data formatting circuitry 16 in FIG. 1 or may be separate from circuitry 16. Image sensor 14 may include a pixel array such as array 32 of pixels 34 (sometimes referred to herein as image sensor pixels, imaging pixels, or image pixels). Control and processing circuitry 44 may be coupled to row control circuitry 40 via control path 27 and may be coupled to column control and readout circuitry 42 via data path 26.

Row control circuitry 40 may receive row addresses from control and processing circuitry 44 and may supply corresponding row control signals to image pixels 34 over one or more control paths 36. The row control signals may include pixel reset control signals, charge transfer control signals, (anti-)blooming control signals, row select control signals, gain control signals, or any other desired row pixel control signals.

For image pixel readout operations, a pixel row in image pixel array 32 may be selected using row driver circuitry 40 and image data associated with image pixels 34 of that pixel row may be read out by column readout circuitry 42 on column lines 38. Column control and readout circuitry 42 may be coupled to one or more of the columns of pixel array 32 via one or more conductive lines such as column lines 38. A given column line 38 may be coupled to a column of image pixels 34 in image pixel array 32 and may be used for reading out image signals from image pixels 34 and for supplying bias signals (e.g., bias currents or bias voltages) to image pixels 34. In some examples, each column of pixels may be coupled to a corresponding column line 38. Each pixel column line 38 may be coupled to one or more column amplifiers such as column amplifier 50 and one or more analog-to-digital converters such as analog-to-digital converter (ADC) 52. Column amplifiers 50 can be configured to amplify signals read out from array 32. The ADCs 52 can be configured to convert analog readout signals to corresponding digital signals. Although the column amplifiers 50 and ADCs 52 are shown in FIG. 2 as being separate from column control and readout circuitry 42, amplifiers 50 and ADCs 52 can sometimes be considered part of column control and readout circuitry 42. Column readout circuitry 42 can optionally further include column circuitry such as sample and hold circuitry for sampling and storing signals read out from array 32 and/or column memory for storing the readout signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being "horizontal" and "vertical," respectively, rows and columns may refer to any grid-like structure. Features described herein as rows may be arranged vertically and features described herein as columns may be arranged horizontally. The terms "row" and "column" referring to different dimensions of array 32 can sometimes be used interchangeably.

Pixel array 32 may be provided with a color filter array having multiple color filter elements which allows a single image sensor to sample light of different colors. As an example, image sensor pixels such as the image pixels in array 32 may be provided with a color filter array which allows a single image sensor to sample red, green, and blue (RGB) light using corresponding red, green, and blue image sensor pixels. The red, green, and blue image sensor pixels may be arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another example, broadband image pixels having broadband color filter elements (e.g., clear color filter elements) may be used instead of green pixels in a Bayer pattern. These examples are merely illustrative and, in general, color filter elements of any desired color (e.g., cyan, yellow, red, green, blue, etc.) and in any desired pattern may be formed over any desired number of image pixels 34.

It can be challenging to design column ADCs. High sensitivity image sensors can impose demanding read noise criteria. Even if the column circuitry itself has negligible noise, each pixel can exhibit thermal noise, flicker noise, and/or random telegraph signal (RTS) noise. Thermal noise can oftentimes be the dominant noise component. Conventional techniques of using continuous-time sigma delta ADCs or correlated multiple sampling (i.e., where multiple reset and/or signal samples are taken and averaged out to improve the overall signal-to-noise ratio) are, however, imperfect approximations of continuous-time integration. Sigma delta converters are power hungry and require a high-frequency clock signal. Correlated multiple sampling are challenging to implement with standard successive-approximation-register (SAR) ADCs, which will require multiple sets of sampling capacitors. It would therefore be desirable to provide column ADCs with improved noise performance.

Figure 3:
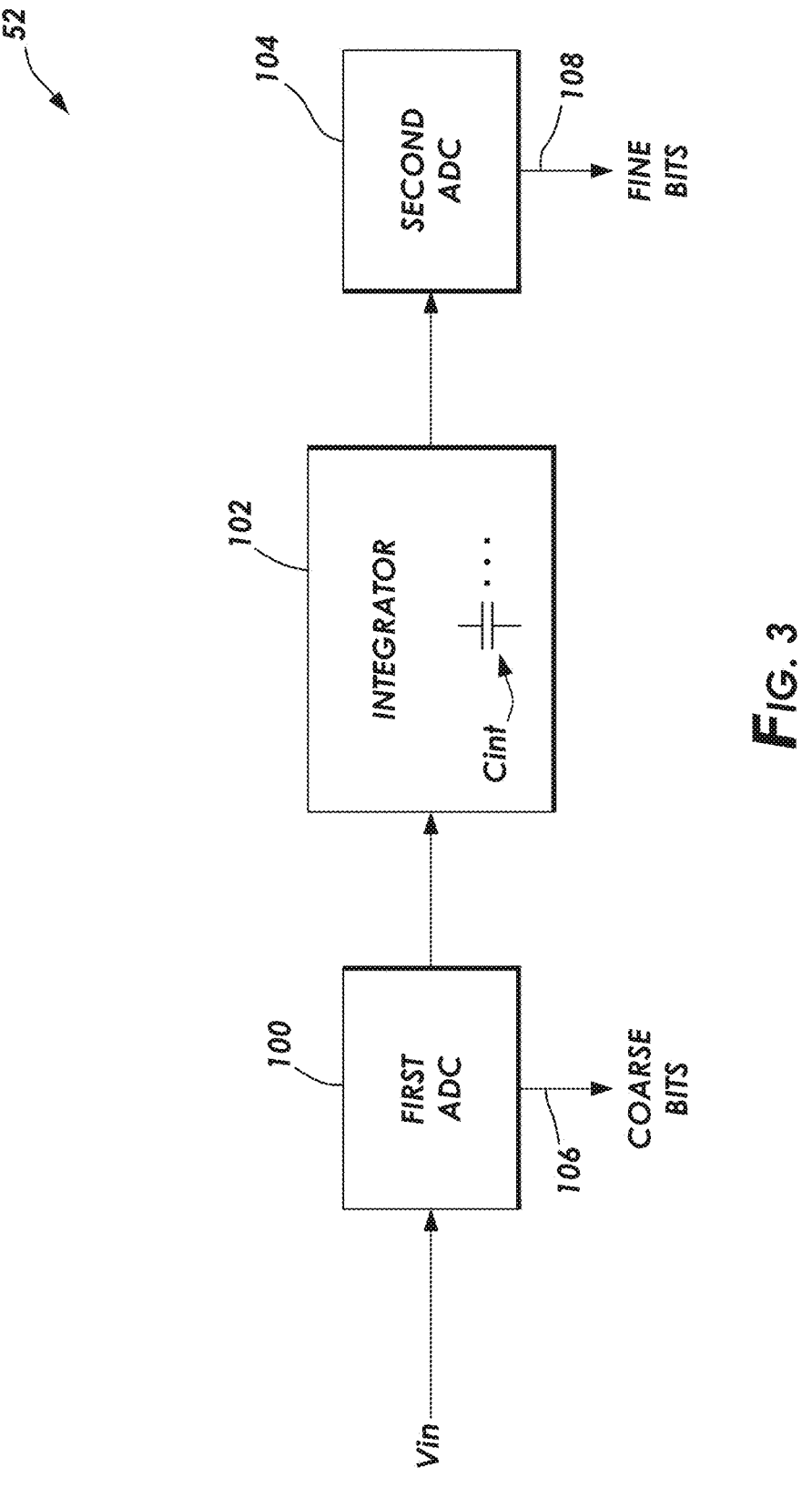
FIG. 3 is a block diagram of illustrative column data converter circuitry in accordance with some embodiments.

FIG. 3 is a block diagram of illustrative column data converter circuitry 52 configured to provide improved noise performance while avoiding the high power and clock issues associated with sigma delta converters. As shown in FIG. 3, data converter circuitry 52 can include a first ADC circuit such as first ADC 100, a second ADC circuit such as second ADC 104, and an integrator circuit such as integrator 102 coupled between the first ADC 100 and the second ADC 104. First ADC circuit 100 can have an input configured to receive an analog voltage signal Vin from a pixel output line (see, e.g., pixel column line 38 in FIG. 2). The analog voltage signal Vin can either represent a reset voltage during a reset phase—sometimes referred to and defined as a sample-and-hold reset or "SHR" phase, or can represent an image signal voltage during a signal phase—sometimes referred to and defined as a sample-and-hold signal or "SHS" phase. The reset voltage is therefore sometimes referred to and defined herein as voltage Vshr, whereas the image signal voltage is sometimes referred to and defined herein as voltage Vshs. The Vshr voltage can be output from a selected imaging pixel when its floating diffusion node has been reset, whereas the Vshs voltage can be output from a selected imaging pixel when its floating diffusion node has received accumulated charged transferred over from a photosensitive element such as a photodiode. In practice, Vshs is less than or equal to Vshr. In the description below, however, Vshs is assumed to be greater than Vshr for easier understanding. This is not a limitation since the pixel output is usually amplified by a column amplifier, which generally inverts the polarity of the pixel voltage before being converted by the ADC. Even if this were not the case, we can invert the polarity of the reference voltages described below to handle the correct polarity of the ADC input.

The first ADC 100 can be configured to output coarse bits at a corresponding ADC output 106. The coarse bits output from ADC 100 can have a corresponding coarse value. The terms coarse bits, coarse value, and coarse code are sometimes used interchangeably herein. The first ADC 100 is thus sometimes referred to and defined herein as a "coarse" ADC stage. As an example, the coarse ADC circuit 100 can be a successive-approximation-register (SAR) ADC. If desired, the coarse ADC stage can be implemented using other types of ADC circuits.

Integrator 102 can be configured to perform a pixel output integration over an integration period, which can have a predetermined duration or time window. During an integration phase, the input voltage (e.g., Vshr or Vshs) can be captured continuously, so the corresponding output is a function of its average value over the integration period/window. Integration of the input can be performed between the coarse and fine conversion operations. For example, integrator 102 can include an integration capacitor Cint for accumulating charge based on the coarse value during the predetermined integration period. Operated in this way, an integrated value can be produced across capacitor Cint.

Second ADC circuit 104 can have an input configured to receive the integrated value from integrator 102. The second ADC 104 can be configured to output fine bits at a corresponding ADC output 108. The fine bits output from ADC 104 can have a corresponding fine value. The terms fine bits, fine value, and fine code are sometimes used interchangeably herein. The second ADC 104 is thus sometimes referred to and defined herein as a "fine" ADC stage. As an example, the fine ADC circuit 104 can be a single-slope ADC, a dual-slope ADC, a successive-approximation-register ADC, or other types of ADC circuits. The coarse bits output from the first ADC 100 can be combined with the fine bits output from the second ADC 104 to obtain a final ADC output value with a combined ADC resolution. The combined ADC resolution or the effective number of bits (ENOB) is roughly equal to the sum of the number of coarse and fine bits minus one. The coarse bits output from first ADC 100 are sometimes referred to as most significant bits or "MSBs," whereas the fine bits output from second ADC 104 are sometimes referred to as least significant bits or "LSBs." As an example, the number of the coarse bits can be less than the number of fine bits. Alternatively, the number of coarse bits can be greater than the number of fine bits. If desired, the number of coarse bits can be equal to the number of fine bits. Embodiments in which the first ADC 100 and the second ADC 104 are implemented using different ADC architectures, such as if the first and second ADC stages are implemented as SAR and single-slope ADCs, respectively, are sometimes referred to as having a "hybrid" ADC architecture.

Figure 4:
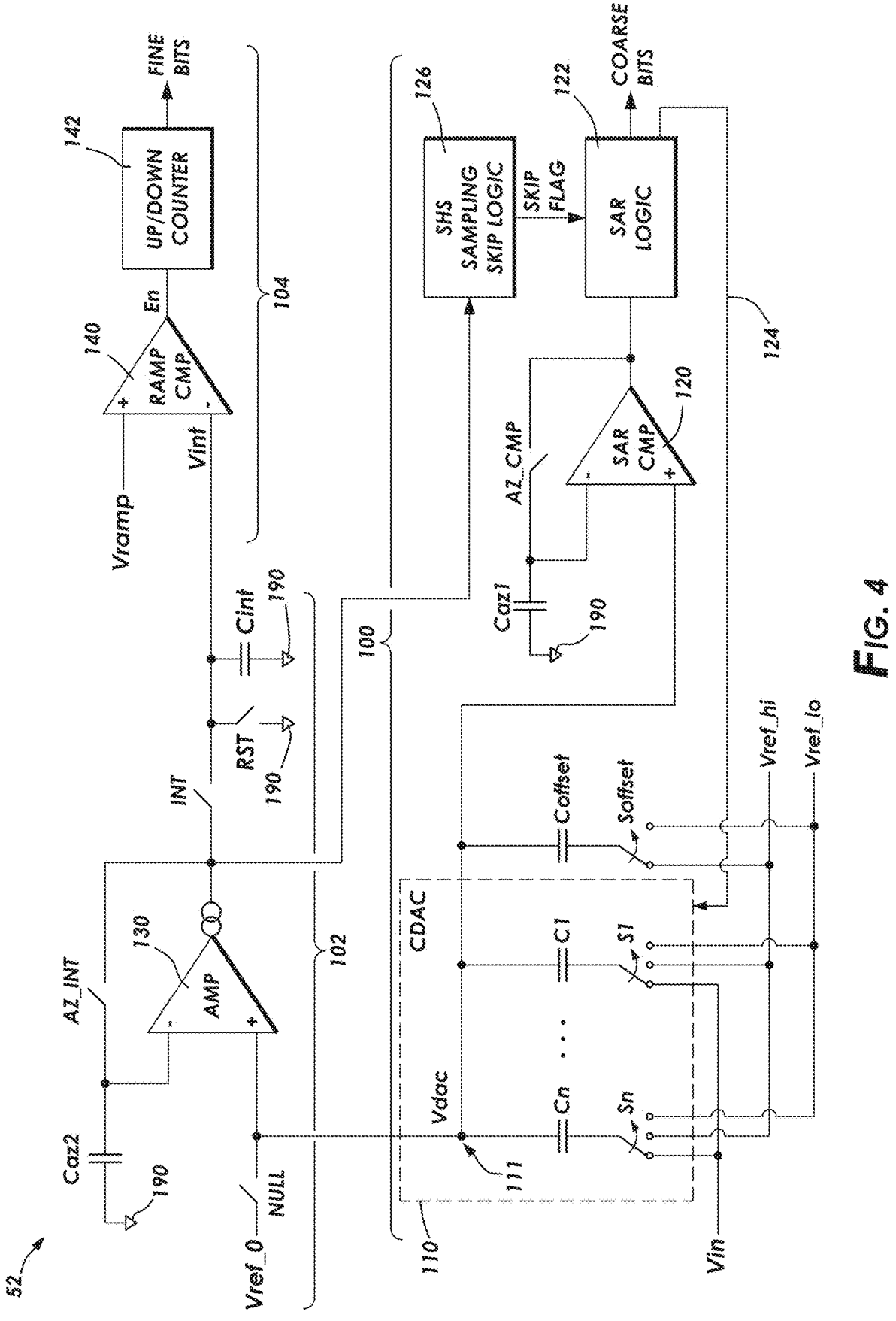
FIG. 4 is a circuit diagram showing an illustrative implementation of column data converter circuitry of the type shown in FIG. 3 in accordance with some embodiments.

FIG. 4 is a circuit diagram showing an illustrative implementation of column data converter circuitry 52 of the type described in connection with FIG. 3. As shown in FIG. 4, the first ADC circuit 100 can be implemented as a successive-approximation-register (SAR) ADC circuit. The SAR ADC circuit 100 can include a capacitor based digital-to-analog converter such as capacitor DAC (or CDAC) 110, a comparator such as SAR comparator 120, associated control logic such as SAR logic 122, and optionally skipping logic such as SHS sampling skip logic 126 for skipping the resampling of coarse bits for the Vshs signal.

In the example of FIG. 4, CDAC 110 may include n capacitors C1, C2, C3, . . . , and Cn, where n can be equal to 2, 3, 4, 5, 5-10, less than 10, or greater than 10. The n capacitors within CDAC 110 can be binary weighted. In other words, capacitor C1 may have a capacitance value C, capacitor C2 may have a capacitance value of 2*C, capacitor C3 may have a capacitance value of 4*C, . . . , and capacitor Cn can have a capacitance value of $2^{(n-1)}$*C. Such binary weighting of capacitors is illustrative. If desired, other capacitive weighting schemes can be employed.

Each of the n capacitors can have a first (top) terminal coupled to a common node 111 and a second terminal coupled to a corresponding switch. A DAC output voltage Vdac can be produced at node 111. The first capacitor C1 can have a second (bottom) terminal coupled to a first switch S1. The second capacitor C2 can have a second (bottom) terminal coupled to a second switch S2. The third capacitor C3 can have a second (bottom) terminal coupled to a third switch S3. Similarly, the n-th capacitor Cn can have a second (bottom) terminal coupled to n-th switch Sn. The intervening capacitors C2, C3, and so on between C1 and Cn and the associated switches S2, S3, and so on are not explicitly drawn in FIG. 4 to avoid overcomplicating the figure. Switch S1 corresponds to one LSB of the coarse code.

Each of the CDAC switches S1-Sn can have a first terminal configured to receive input voltage Vin, a second terminal coupled to a high reference voltage Vref_hi, a third terminal coupled to a low reference voltage Vref_lo, and a fourth terminal coupled to a corresponding CDAC capacitor. The high reference voltage Vref_hi may be greater than the low reference voltage Vref_lo. The difference between voltages Vref_hi and Vref_lo corresponds to the input voltage swing needed to saturate the ADC output. Each CDAC switch can be configured to operate in a first mode during which its first terminal is coupled to its fourth terminal for passing Vin to the corresponding CDAC capacitor, a second mode during which its second terminal is coupled to its fourth terminal for passing Vref_hi to the corresponding CDAC capacitor, and a third mode during which its third terminal is coupled to its fourth terminal for passing Vref_lo to the corresponding CDAC capacitor. Each CDAC switch operable among three different modes in this way is sometimes referred to as a single-pole triple-throw (SP3T) switch.

Data converter circuitry 52 can optionally further include an additional capacitor such as capacitor Coffset. Capacitor Coffset is sometimes referred to as an offset capacitor. Offset capacitor Coffset can have a first terminal coupled to node 111 and a second terminal coupled to a corresponding offset switch Soffset. Switch Soffset may have a first terminal coupled to Vref_hi, a second terminal coupled to Vref_lo, and a third terminal coupled to capacitor Coffset. Offset switch Soffset can be configured to operate in a first mode during which its first terminal is coupled to its third terminal for passing Vref_hi to capacitor Coffset and a second mode during which its second terminal is coupled to its third terminal for passing Vref_lo to capacitor Coffset. The offset switch Soffset operable between two different modes in this way is sometimes referred to as a single-pole double-throw (SPDT) switch. Although components Coffset and Soffset are shown as being separate from CDAC 110 in FIG. 4, components Coffset and Soffset can sometimes be considered part of CDAC 110. The purpose and function of these offset components are described in more detail below in connection with FIGS. 5 and 6.

The SAR comparator 120 can be configured to receive voltage Vdac from DAC output node 111. Comparator 120 may have a first (positive) input coupled to CDAC node 111, a second (negative) input, and an output coupled to the second input via an autozero switch AZ_CMP. Switch AZ_CMP may be referred to as a SAR comparator autozeroing switch. A shunt capacitor Caz1 can be coupled at the second input of comparator 120. In other words, capacitor Caz1 can have a first terminal coupled to the negative input of comparator 120 and a second terminal coupled to a ground power supply line 190 (e.g., a ground line on which a ground power supply voltage is provided).

SAR (control) logic 122 may have an input coupled to the output of SAR comparator 120 and can be configured to output one or more signals, via control path 124, for controlling the switches within CDAC 110 and also optionally switch Soffset. In general, successive-approximation-register ADC 100 uses capacitive DAC 110, comparator 120, and SAR logic 122 to perform a binary search algorithm. The CDAC 110 may be configured to output an analog voltage Vdac that is compared, using comparator 120, to a comparator threshold voltage that is some function of the pixel voltage Vin. The voltage Vdac output by CDAC 110 may be varied, thereby effectively allowing successive comparisons to Vin. Each comparison may further narrow the range of possible values of Vin, with the number of comparisons determining the resolution of the coarse conversion. The voltage Vdac output from CDAC 110 may be a known function of one or more reference voltages such as Vref_lo and Vref_hi. The term "coarse step" can refer to the change in Vdac corresponding to one LSB of the coarse code (or S1). This can generally be chosen to be between 10 mV and 100 mV, and the number of coarse and fine bits can be determined based on this value and/or the effective number of bits required of the final ADC output.

The CDAC 110 may receive signals from SAR control logic 122 that determine the CDAC output Vdac. The SAR comparator 120 may be configured to perform a comparison of Vdac to the SAR comparator threshold. The output of comparator 120 may be provided to SAR control logic 122. The comparator output signal may have a value indicative of which signal has a higher voltage (e.g., the comparator output may be asserted at a logic high level "1" if Vdac is greater than the comparator threshold or may be driven to logic low level "0" if Vdac is less than the comparator threshold). SAR control logic 122 of FIG. 4 may sometimes be referred to as processing circuitry. Processing circuitry 122 may track the results of comparisons by comparator 120 and adjust the output of CDAC 110 accordingly. Processing circuitry 122 may ultimately output the result of the analog-to-digital conversion as coarse bits. The operations of SAR logic 122 can optionally be skipped, using SHS sampling skip logic 126, to bypass certain input sampling and conversion steps. The SHS sampling skip logic 126 can be configured to output a skip flag that is asserted when skipping is appropriate or deasserted when skipping should not be performed. The purpose and function of skip logic 126 are described in more detail below in connection with FIGS. 5 and 6.

Still referring to FIG. 4, integrator 102 may include an amplifying circuit such as amplifier 130 coupled to an integration capacitor Cint. Amplifier 130 may have a first (positive) input coupled to DAC output node 111, a second (negative) input, and an output coupled to its second input via an associated autozero switch AZ_INT. The first input of amplifier 130 can be selectively coupled to reference voltage Vref_0 via a null (nulling) switch NULL. When switch NULL is activated, voltage Vref_0 may be applied at the first input of amplifier 130. When switch NULL is deactivated, the first input of amplifier 130 may be decoupled from Vref_0. Voltage Vref_0 can be equal to Vref_lo, a ground voltage, a low voltage, or other suitable static (DC) voltage. Switch AZ_INT may be referred to as an integrator amplifier autozeroing switch. A shunt capacitor Caz2 can be coupled at the second input of amplifier 130. In other words, capacitor Caz2 can have a first terminal coupled to the negative input of amplifier 130 and a second terminal coupled to ground line 190.

The term "activate" with respect to a switch (or transistor) may refer to or be defined herein as an action that places the switch in an "on" or low-impedance state such that the two terminals of the switch are electrically connected to conduct current. Activating a switch can sometimes be referred to as turning on or closing a switch. The term "deactivate" with respect to a switch (or transistor) may refer to or be defined herein as an action that places the switch in an "off" or high-impedance state such that the two terminals of the switch/transistor are electrically disconnected with minimal leakage current. Deactivating a switch can sometimes be referred to as turning off or opening a switch.

Amplifier 130 may be a transconductance amplifier. A transconductance amplifier can refer to an amplifier circuit configured to convert an input voltage into a corresponding output current. The output of amplifier 130, sometimes referred to as an amplifier output, may be coupled to SHS sampling skip logic 126, and is selectively coupled to capacitor Cint via integration switch INT. When switch INT is activated, amplifier 130 may output a current that charges up capacitor Cint. When switch INT is deactivated, capacitor Cint may be decoupled from the amplifier output. Integrator 102 can further include a reset switch RST that is coupled in parallel with capacitor Cint. Reset switch RST may have a first terminal shorted to capacitor Cint and a second terminal coupled to ground 190. Reset switch RST can be selectively activated to discharge capacitor Cint towards zero volts. The voltage stored on capacitor Cint is sometimes referred to herein as an integration voltage Vint.

Second ADC 104 can include a comparator such as comparator 140 and an associated counter 142. Comparator 140 may have a first (negative) input configured to receive Vint from integrator 102, a second (positive) input configured to receive a ramp voltage Vramp, and an output coupled to counter 142. The ramp voltage Vramp can be voltage that increases (ramps up) or decreases (ramps down) linearly over time. Comparator 140 configured to receive a ramp voltage is sometimes referred to as a ramp comparator. During fine conversion operations, the counter 142 can either count up or count down depending on the output of ramp comparator 140. The resulting value produced by counter 142 can be used to compute the LSBs for the final ADC output. In general, the second ADC stage 104 can be a single-slope ADC, a SAR ADC, a multi-slope ADC, or other types of ADC circuits.

The example of FIG. 4 in which a separate amplifier 130 is used to charge up Cint during an integration phase is illustrative. In other embodiments, transconductance amplifier 130 can optionally be omitted, and the SAR comparator 120 can be configured to selectively charge up capacitor Cint (without an intervening amplifier). This is possible because the differential voltage at the inputs of the SAR comparator 120 will be the same as the differential voltage at the inputs of transconductance amplifier 130 during the integration phase, except for polarity. Using the SAR comparator 120 to directly charge Cint might impose a rather low transconductance value on comparator 120 in order to keep capacitor Cint reasonably small. Lowering the transconductance of the SAR comparator 120 can, however, affect the SAR conversion speed.

Figure 6:
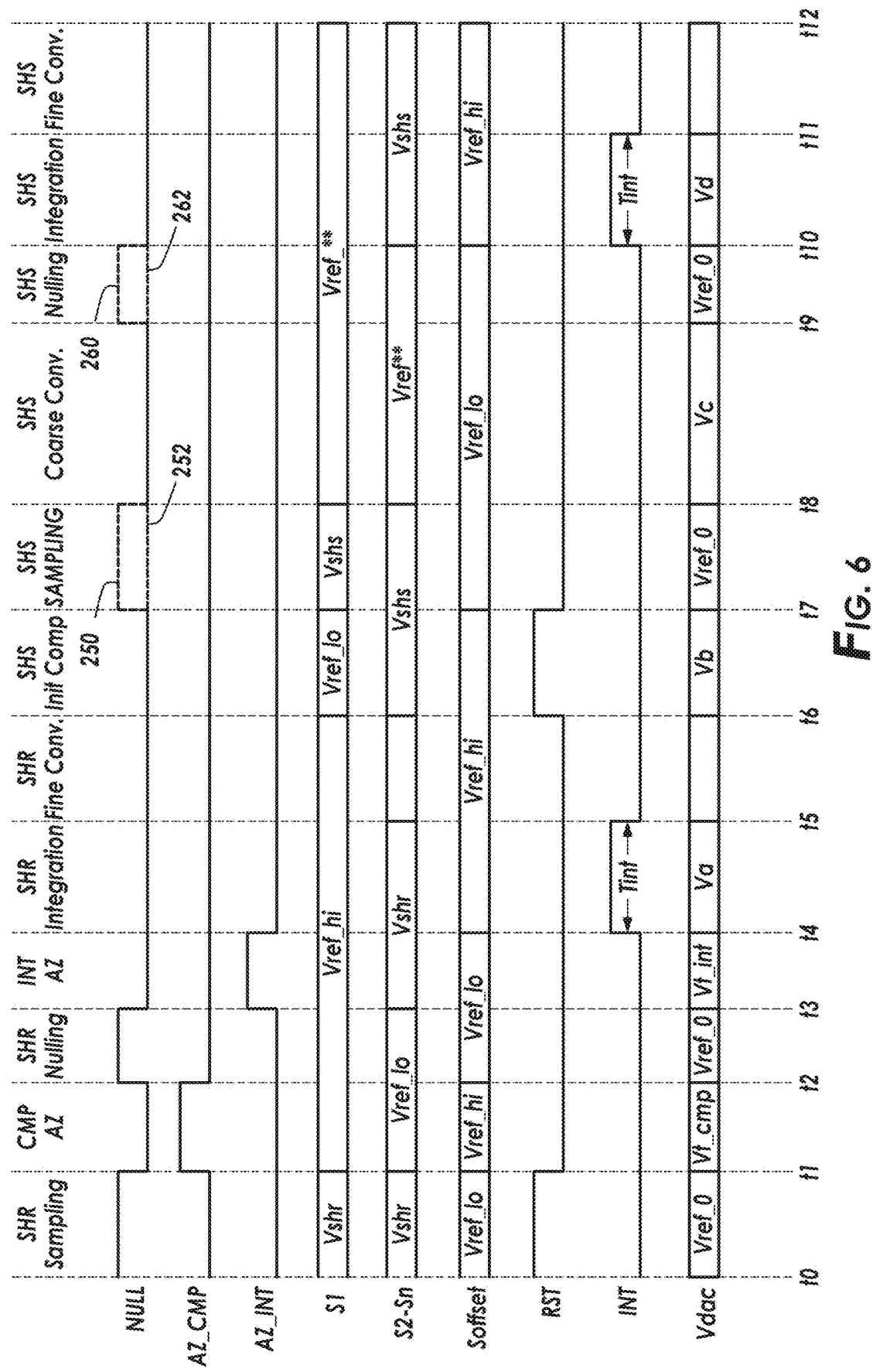
FIG. 6 is a timing diagram showing illustrative waveforms during pixel readout using the steps shown in FIG. 5 in accordance with some embodiments.

FIG. 5 is a flowchart of illustrative steps for operating data converter circuitry 52 of the type described in connection with FIGS. 3 and 4. The operations of FIG. 5 are best understood in conjunction with the timing diagram of FIG. 6, so references to both FIGS. 5 and 6 are described below in tandem. During the operations of block 200 in FIG. 5, an SHR value can be sampled. This operation is thus sometimes described as an SHR sampling phase. The SHR sampling phase can extend from time t0 to time t1 in FIG. 6. During the SHR sampling phase, the NULL switch can be activated to drive voltage Vdac to reference voltage Vref_0, the CDAC switches S1-Sn can be configured to pass the reset voltage Vshr to each capacitor in the CDAC 110, the offset switch Soffset can be configured to pass Vref_lo to capacitor Coffset, and the reset switch RST can be activated to completely discharge capacitor Cint. In other words, the integration capacitor Cint can be reset to 0 V during the SHR sampling phase, assuming ground is at 0 V. The reset voltage Vshr provided on the pixel column line may be reasonably well settled prior to being sampled on the bottom plates of each CDAC capacitor. At the end of time t1, voltage Vshr is sampled onto the CDAC capacitors.

During the operations of block 202 in FIG. 5, the SAR comparator 120 can be autozeroed. This operation is thus sometimes described herein as a comparator autozero (AZ) phase. The comparator AZ phase can extend from time t1 to t2 in FIG. 6. During the comparator AZ phase, only switch S1 is thrown to Vref_hi while all remaining CDAC switches S2-Sn are thrown to Vref_lo. This will cause Vdac to shift to a new voltage level sometimes referred to herein as a comparator threshold Vt_cmp. Comparator threshold voltage Vt_cmp produced in this way while only switch S1 is switched to Vref_hi is sometimes referred to as a "pedestal" value. During this time, the comparator autozeroing switch AZ_CMP can be activated to set the trip point of SAR comparator 120 to Vt_cmp. Switch Soffset can also be toggled to pass Vref_hi to capacitor Coffset during the comparator AZ phase.

During the operations of block 204 in FIG. 5, the NULL switch can be activated again. This operation is thus sometimes described herein as an SHR nulling phase. The SHR nulling phase can extend from time t2 to t3 in FIG. 6. During the SHR nulling phase, the nulling switch can set Vdac back to Vref_0 while switch Soffset is thrown back to Vref_lo.

During the operations of block 206 in FIG. 5, the integrator 102 can be autozeroed. This operation is thus sometimes described herein as an integrator autozero (AZ) phase. The integrator AZ phase can extend from time t3 to t4 in FIG. 6. During the integrator AZ phase, switches S2-Sn are thrown back to Vin while only switch S1 remains connected to Vref_hi. At this point, the positive (+) input of amplifier 130 is now directly coupled to the Vshr voltage through the CDAC capacitors. During the integrator AZ phase, the amplifier autozeroing switch AZ_INT can be activated, which can set Vdac to an integrator threshold Vt_int. While switch AZ_INT is activated, there should be no voltage difference across the + and − terminals of amplifier 130, so amplifier 130 should not generate any output current.

During the operations of block 208 in FIG. 5, the Vshr voltage sampled on the CDAC capacitors can produce a Vdac having a voltage level Va. Amplifier 130 can then output, based on a difference between Va and Vt_int (sometimes referred to and defined herein as a "residue" voltage) at its input, a corresponding current for charging Cint for a certain integration duration Tint. This approach thus employs the SAR process to reduce the residue to a small voltage value, so that any jitter on Tint will have a much smaller effect on the final output. This operation is sometimes described herein as an SHR integration phase. The SHR integration phase can extend from time t4 to t5 in FIG. 6. During the SHR integration phase, switch Soffset is switched from Vref_lo to Vref_hi to add a small amount of offset to the SHR integration voltage prior to integration. Ideally, the SHS voltage is equal to the SHR voltage under dark conditions. In practice, however, the SHS voltage might be slightly lower than the SHR voltage due to incomplete settling, noise, IR drops and other non-idealities. A small added offset can help ensure that SHS corresponds to the same coarse code as SHR, and not one less, even during such non-ideal scenarios. Having the same coarse code for SHR and SHS eliminates the need for resampling, which incurs kT/C noise, as described later.

For instance, the offset can be set equal to some fraction of a coarse step. As an example, the offset can be set equal to 0.25 of a coarse step. The amount of offset can be a function of the CDAC and the offset capacitor. To provide an offset of 0.25 of a coarse step, capacitor Coffset can be set to have a capacitance of 0.25*C assuming LSB capacitor C1 in CDAC 110 has a capacitance C. This ratio is exemplary. If desired, offset capacitor Coffset can have a capacitance value that is less than C, that is 10-20% of C, 20-30% of C, 30-40% of C, 40-50% of C, or other fraction of C. In general, such offset shifts the autozero values of both comparator 120 and amplifier 130 so that amplifier 130 always integrates a voltage between 0 and 1 coarse step.

During the integration phase, switch INT can be activated for a predetermined duration Tint so that amplifier 130 can output a current, which is a function of the sampled Vshr, that is integrated onto capacitor Cint to produce a corresponding integrated voltage Vint. The integration duration Tint can be relatively long (longer than typical input sampling periods) to help average out the high-frequency noise. For example, integration duration Tint can be equal to or greater than 100 ns (nanoseconds), equal to or greater than 200 ns, equal to or greater than 300 ns, equal to or greater than 400 ns, equal to or greater than 500 ns, equal to or greater than 1 us (microsecond), etc. It may not be possible to have such long input sampling periods for conventional SAR and ramp ADCs without slowing down the column circuitry to such an extent that would lead to incomplete settling. The transconductance amplifier 130 can be reasonably linear over one coarse code, and any noise associated with Vin can be averaged out over the integration period.

During the operations of block 210 in FIG. 5, SHR fine conversion operations can be performed. This operation is thus sometimes described herein as an SHR fine conversion phase. The SHR fine conversion phase can extend from time t5 to t6 in FIG. 6. During the SHR fine conversion phase, the integrated Vint value produced from the SHR integration phase can be converted by single-slope ADC 104 of FIG. 4. During the SHR fine conversion phase, counter 104 can be configured to keep counting up until the ramp comparator 140 trips. It is worth noting that only the fine conversion of SHR is performed while the coarse conversion for SHR is skipped entirely. Instead, the coarse code for SHR is forced to a known value of one (e.g., . . . 001). For SHS, this coarse value is changed only when the image signal crosses a coarse code boundary.

During the operations of block 212 in FIG. 5, an SHS value can be compared to the SHR value to determine whether to skip a subsequent SHS sampling. This operation is sometimes referred to herein as an SHS initial comparison phase. The SHS initial comparison phase can extend from time t6 to t7 in FIG. 6. During the SHS initial comparison phase, switch S1 can be toggled from Vref_hi to Vref_lo to decrease Vdac by one coarse step. This can cause Vdac to shift to a different voltage level Vb. Once the SHS value is settled, SHS sampling skip logic 126 can check the output of transconductance amplifier 130. If the amplifier output is low, the coarse value is same for both SHS and SHR, so skip control logic 126 can assert or set a skip flag high. In such scenarios, the operations of blocks 214, 216, and 218 can all be bypassed and processing can proceed directly to block 220, as shown by arrow 213. Bypassing block 214 in this way without having to resample the SHS value can be technically advantageous to avoid incurring thermal (kT/C) noise of the CDAC 110 under low light conditions. Alternatively, if the amplifier output is high, the coarse code for SHS and SHR are different. In such scenarios, the skip control logic 126 can deassert or set the skip flag low, and processing will proceed to block 214.

In some implementations, there is no need to check for SHS coarse value going below the SHR coarse value, assuming an appropriate offset amount has been set. In alternative implementations, such SHS coarse underflow checking can be implemented if needed. It should be noted that the presence of the skip control logic 126 is optional. In some implementations, the SHS sampling is always performed if the additional kT/C noise of the CDAC 110 is acceptable.

During the SHS initial comparison phase, switch RST can also be activated to completely discharge capacitor Cint. This is illustrative. If desired, switch RST can be performed later such as at time t7, t8, or t9, as long as the reset is performed prior to the next SHS integration phase at time t10.

During the operations of block 214 in FIG. 5, an SHS value can be sampled. This operation is thus sometimes referred to as an SHS sampling phase. The SHS sampling phase can extend from time t7 to time t8 in FIG. 6. During the SHS sampling phase, the NULL switch can be activated (as shown by dotted waveform 250) to drive voltage Vdac to reference voltage Vref_0, the CDAC switches S1-Sn can be configured to pass the image signal voltage Vshs to each capacitor in the CDAC 110, and the offset switch Soffset can be configured to pass Vref_lo to capacitor Coffset. The image signal voltage Vshs provided on the pixel column line may be reasonably well settled prior to being sampled on the bottom plates of each CDAC capacitor. At the end of time t8, voltage Vshs is sampled onto the CDAC capacitors. If the operations of block 214 were to be skipped, then the NULL switch can remain deactivated during this phase, as shown by dotted waveform 252.

During the operations of block 216, an SHS coarse conversion can be performed. This operation is thus sometimes referred to as an SHS coarse conversion phase. The SHS coarse conversion phase can extend from time t8 to t9 in FIG. 6. During this time, Vdac can have a voltage level Vc. During the SHS coarse conversion phase, the SAR ADC circuit 100 performs a coarse conversion by performing a binary search on the sampled Vshs signal. During this time, the switches Sn-S1 can be successively toggled, as indicated by varying voltage Vref_**, until Vdac is less than or equal to the threshold voltage Vt_int obtained during the integrator AZ phase but within one coarse voltage step.

During the operations of block 218 in FIG. 5, the NULL switch can be activated again, as indicated by dotted waveform 260 in FIG. 6. This operation is thus sometimes described herein as an SHS nulling phase. The SHS nulling phase can extend from time t9 to t10 in FIG. 6. During the SHR nulling phase, the nulling switch can set Vdac back to Vref_0. If the operations of block 218 were to be skipped, then the NULL switch can remain deactivated during this phase, as shown by dotted waveform 262.

During the operations of block 220 in FIG. 5, the Vshs voltage sampled on the CDAC can be used to perform charge integration. This operation is sometimes described herein as an SHS integration phase. The SHS integration phase can extend from time t10 to t11 in FIG. 6. During this time, switches S2-Sn can be thrown to Vin so that the CDAC capacitors can produce a Vdac having a voltage level Vd. During the SHS integration phase, switch Soffset can be switched from Vref_lo to Vref_hi to add a small amount of offset to the SHS integration voltage prior to integration. A small added offset can help ensure that SHS corresponds to the same coarse code as SHR during dark conditions, even in the presence of non-idealities as described above. Amplifier 130 can then output, based on a difference between Vd and Vt_int (sometimes referred to and defined herein as a "residue" voltage) at its input, a corresponding current for charging Cint for a certain integration duration. This approach thus employs the SAR process to reduce the residue to a small voltage value, so that any jitter on Tint will have a much smaller effect on the final output. During the integration phase, switch INT can be activated for a predetermined duration so that amplifier 130 can output a current, which is a function of the sampled Vshs, that is integrated onto capacitor Cint to produce a corresponding integrated voltage Vint.

During the operations of block 222 in FIG. 5, SHS fine conversion operations can be performed. This operation is thus sometimes described herein as an SHS fine conversion phase. The SHS fine conversion phase can extend from time t11 to t12 in FIG. 6. During the SHS fine conversion phase, the integrated Vint value produced from the SHS integration phase can be converted by single-slope ADC 104 of FIG. 4. During the SHS fine conversion phase, counter 104 can be configured to keep counting down until the ramp comparator 140 trips. This example in which counter 142 is configured to count up during the SHR fine conversion phase and to count down during the SHS fine conversion phase is illustrative. Alternatively, counter 142 can be configured to count down during the SHR fine conversion phase and to down up during the SHS fine conversion phase.

During the operations of block 224 in FIG. 5, the coarse bits (value) obtained from the SHS coarse conversion phase and the fine bits (value) obtained from the SHS fine conversion phase can be combined to compute the final ADC readout in the digital domain. For the final ADC output value, the coarse value may be shifted left by a number of bits and then added to a scaled version of the fine value. The scaled version of the fine value may be computed by applying a scaling factor to the fine bits. The scaling factor for each pixel column can be determined initially or periodically during a calibration phase, as described in more detail below in connection with FIGS. 7 and 8.

To combine the coarse and fine values for the final ADC output, calibration is required. While each pixel column has to be calibrated individually, the various columns can be calibrated in parallel in one row readout time. Such calibration, sometimes referred to herein as "column" calibration, can be performed at the beginning to every frame or once every predetermined number of frames.

Figure 7:
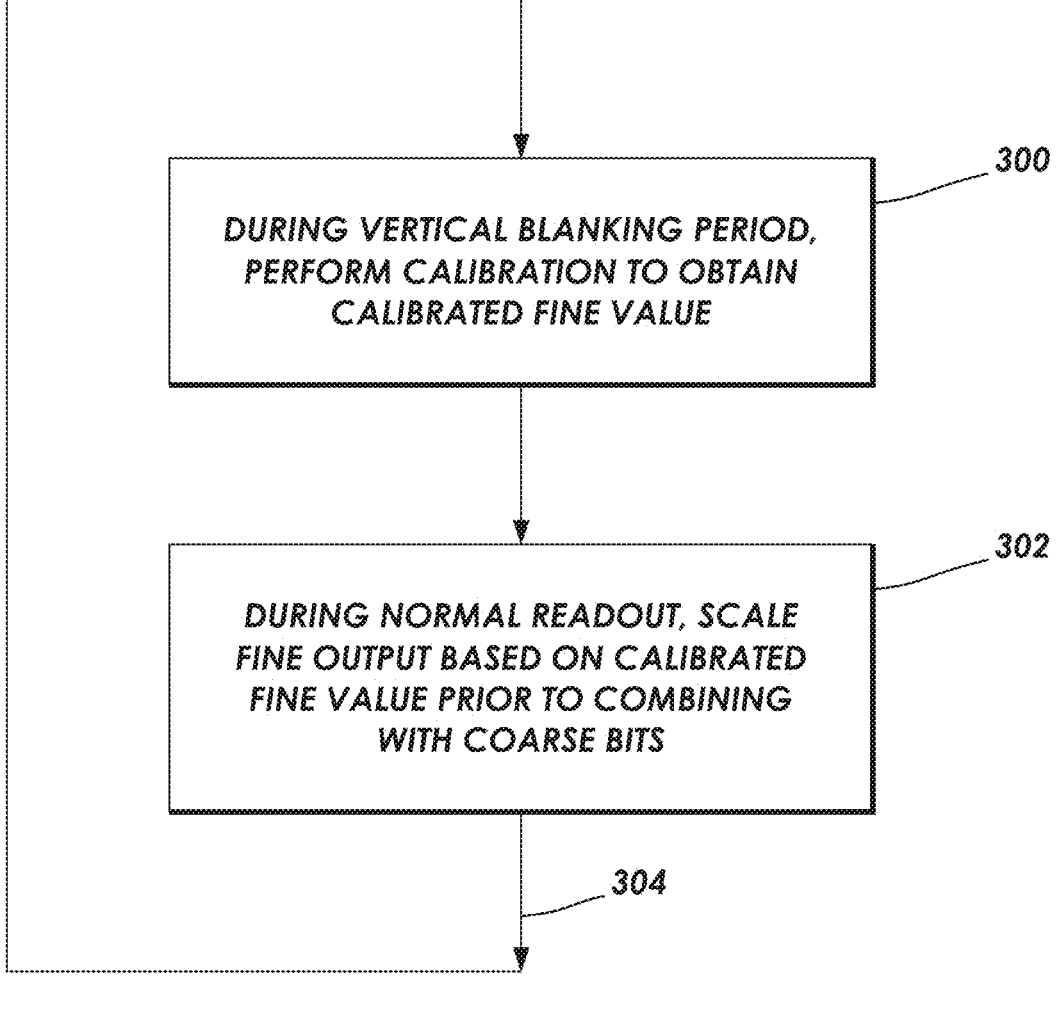
FIG. 7 is a flowchart of illustrative steps for performing data converter calibration during vertical blanking periods in accordance with some embodiments.

In one embodiment, the column calibration operations can be performed during vertical blanking periods. FIG. 7 is a flowchart of illustrative steps for performing data converter calibration during vertical blanking periods. During vertical blanking periods, column calibration can be performed to obtain a calibrated fine value (see operations of block 300). During the calibration phase, the input of each column amplifier 50 (see FIG. 2) can be disconnected from the pixel array 32. The calibrated fine value, sometime referred to as a calibrated fine code, can correspond to one coarse code difference or one LSB coarse step of the input.

During normal readout periods, the steps of FIG. 5 can be performed to obtain coarse and fine values, and the fine value can be scaled based on the calibrated fine value obtained from block 300 prior to combining with the coarse value (see operations of block 302). A scaling factor can be obtained by computing a reciprocal of the calibrated fine value. The fine value output from the second ADC circuit 104 at the end of block 222 can then be scaled by the scaling factor. Scaled fine codes can optionally be precomputed for different calibration values (i.e., different scaling factors) and stored in a lookup table (LUT) to avoid division operations, which can be relatively slow, during readout. The scaled fine value can then be combined with a shifted version of the coarse code.

Figure 8:
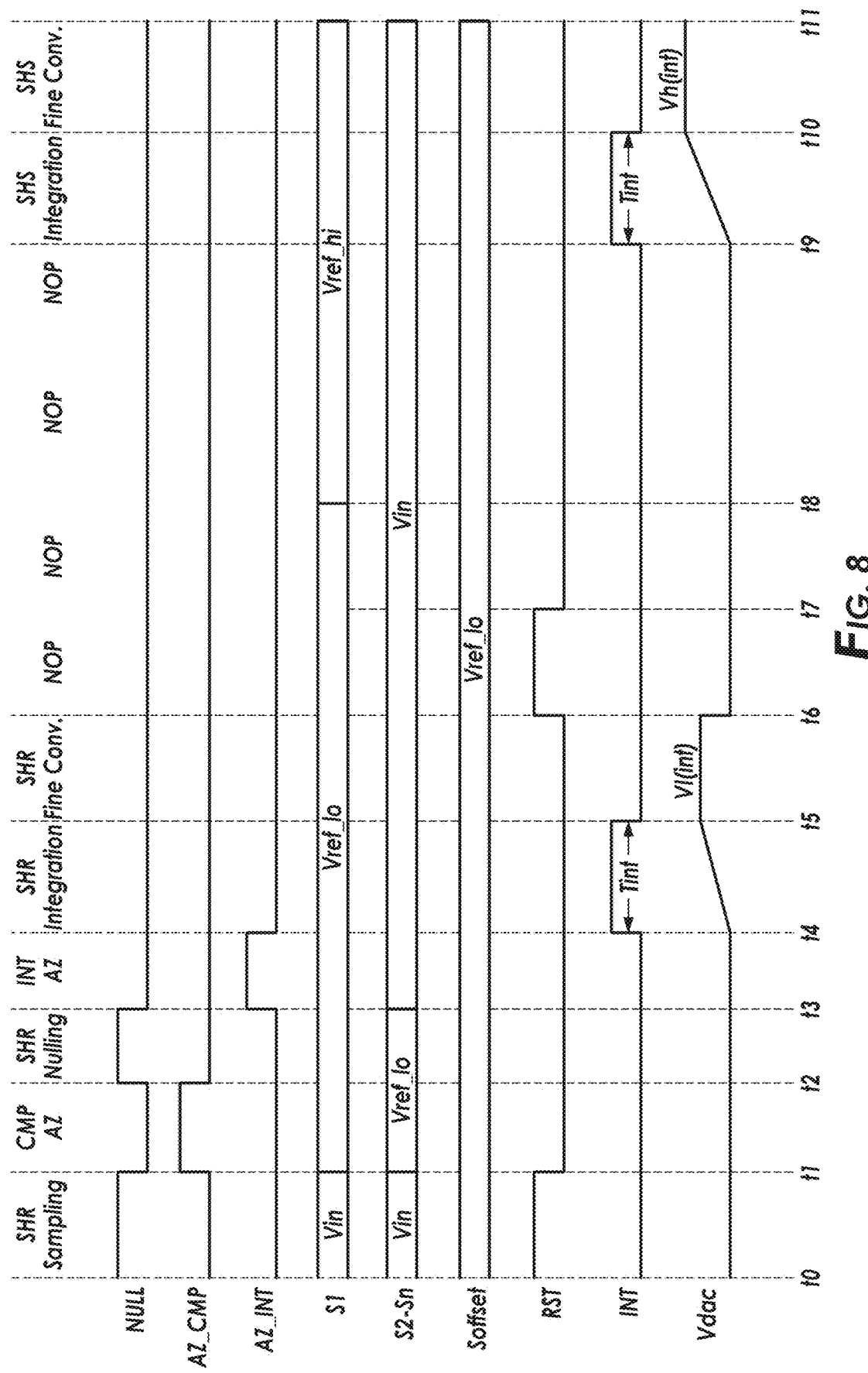
FIG. 8 is a timing diagram showing illustrative waveforms during column calibration for obtaining calibrated fine codes in accordance with some embodiments.

FIG. 8 is a timing diagram showing illustrative waveforms during data converter (column) calibration that can be performed during block 300 of FIG. 7 in accordance with some embodiments. The various phases of the calibration operation are similar to the active row readout described in connection with FIGS. 5 and 6 with some differences. For instance, switch S1 is kept at Vref_lo until the end of the SHR fine conversion phase and can subsequently be switched to Vref_hi, whereas switch Soffset is tied to Vref_lo throughout the entirety of the calibration process. Moreover, after SHR fine conversion, the SHS initial comparison phase, the SHS sampling phase, the SHS coarse conversion phase, and the SHS nulling phase can all be skipped—as illustrated by the no-operation ("NOP") notation in the timing diagram of FIG. 8.

An SHR sampling phase can extend from time t0 to time t1. During the SHR sampling phase, the NULL switch can be activated to drive voltage Vdac to reference voltage Vref_0, the CDAC switches S1-Sn can be configured to pass an input voltage Vin to each capacitor in the CDAC 110, and the reset switch RST can be activated to completely discharge capacitor Cint. In other words, the integration capacitor Cint can be reset to 0 V during the SHR sampling phase, assuming ground is at 0 V. Since the column amplifier is disconnected from the pixel column, Vin is not connected to any pixel but is instead biased to some static voltage level. This static voltage level can optionally be equal to the reset voltage Vshr. At the end of time t1, voltage Vin or Vshr is sampled onto the CDAC capacitors.

A comparator autozero (AZ) phase can extend from time t1 to time t2. During the comparator AZ phase, all of the CDAC switches S1-Sn are thrown to Vref_lo. During this time, the comparator autozeroing switch AZ_CMP can be activated to set the trip point of SAR comparator 120.

An SHR nulling phase can extend from time t2 to time t3. During the SHR nulling phase, the nulling switch can set Vdac back to Vref_0.

An integrator autozero (AZ) phase can extend from time t3 to time t4. During the integrator AZ phase, switches S2-Sn are thrown back to Vin while only switch S1 remains connected to Vref_lo. At this point, the positive (+) input of amplifier 130 is now directly coupled to the Vin voltage through the CDAC capacitors. During the integrator AZ phase, the amplifier autozeroing switch AZ_INT can be activated, which can set Vdac to an integrator threshold Vt_int. While switch AZ_INT is activated, there should be no voltage difference across the + and − terminals of amplifier 130, so amplifier 130 should not generate any output current.

An SHR integration phase can extend from time t4 to time t5. Amplifier 130 can output, based on a residue voltage at its input, a corresponding current for charging Cint for a certain integration duration Tint. During the integration phase, switch INT can be activated for a predetermined duration Tint so that amplifier 130 can output a current, which is a function of the sampled input voltage, that is integrated onto capacitor Cint to produce a corresponding integrated voltage Vint. During this time, the voltage on capacitor Cint (see voltage Vint in FIG. 8) can charge up to a first voltage level Vl(int) at the end of the SHR integration phase. This voltage can be close to zero since integrator 102 sees the auto-zeroed value and outputs very little current during this phase.

An SHR fine conversion phase can extend from time t5 to time t6. During the SHR fine conversion phase, the integrated Vint having voltage level Vl(int) value produced from the SHR integration phase can be converted by single-slope ADC 104 of FIG. 4. During the SHR fine conversion phase, counter 104 can be configured to keep counting up until the ramp comparator 140 trips. After time t6, the reset switch RST can be activated to completely discharge capacitor Cint. This reset operation can be performed after the SHR fine conversion phase and any time before the SHS integration phase at time t9. Sometime later such as at time t8, switch S1 can be thrown from Vref_lo to Vref_hi to set one step for the coarse code. FIG. 8 shows how from time t6 to time t9, none of the SHS comparison, (re)sampling, conversion, and nulling operations are performed since there is no SHS value to be processed for calibration.

An SHS integration phase can extend from time t9 to time t10. Although this phase is described and labeled herein as an "SHS" integration phase, there is no SHS value being sampled, so the integration phases at time t4 and t9 can more generically be referred to as "first" and "second" integration phases, respectively. During this (second) integration phase, amplifier 130 can output, based on a residue voltage at its input, a corresponding current for charging Cint for a certain integration duration. During the integration phase, switch INT can be activated for a predetermined duration so that amplifier 130 can output a current, which is a function of the residue voltage, that is integrated onto capacitor Cint to produce a corresponding integrated voltage Vint. During this time, the voltage on capacitor Cint (see voltage Vint in FIG. 8) can charge up to a second voltage level Vh(int) at the end of the second integration phase. Voltage level Vh(int) at the end of the second integration phase may be greater than voltage level Vl(int) at the end of the first integration phase since the charge now should correspond to one coarse code because of the toggling of switch S1 between the two integration phases.

An SHS fine conversion operation can extend from time t10 to t11. Although this phase is described and labeled herein as an "SHS" fine conversion phase, there is no SHS value being sampled, so this phase can be more generally referred to as the calibration fine conversion phase. During the fine conversion phase, the integrated Vint having voltage level Vh(int) produced from the second integration phase can be converted by single-slope ADC 104 of FIG. 4. During the fine conversion phase, counter 104 can be configured to keep counting down until the ramp comparator 140 trips. This example in which counter 142 is configured to count up during the SHR (first) fine conversion phase and to count down during the second fine conversion phase is illustrative. Alternatively, counter 142 can be configured to count down during the first fine conversion phase and to down up during the second fine conversion phase.

At the end of the calibration, only the fine counter value is used. This fine counter value corresponds to one coarse code difference (step). For each regular readout, the coarse and fine values are combined to compute the final ADC value. For example, the coarse code can be left shifted by m bits and then added to the fine code multiplied by $2^m$/ (calibrated fine counter value), where m is an integer based on the resolution of the fine ADC 104. If desired, the operation of $2^m$/(calibrated fine counter value) can be precomputed for different calibration values and stored in a LUT to help improve the overall readout performance.

Configuring and operating an image sensor in this way can be technically advantageous and beneficial to provide true integration to average out and mitigate thermal and flicker noise, reduce pixel crosstalk, and provide reduced power consumption relative conventional ADC architectures. The operations described in connection with FIGS. 5-8 are illustrative. In some embodiments, one or more of the described operations may be modified, replaced, or omitted. In some embodiments, one or more of the described operations may be performed in parallel. In some embodiments, additional processes may be added or inserted between the described operations. If desired, the order of certain operations may be reversed or altered and/or the timing of the described operations may be adjusted so that they occur at slightly different times. In some embodiments, the described operations may be distributed in a larger system.

The foregoing is merely illustrative and various modifications can be made to the described embodiments. The foregoing embodiments may be implemented individually or in any combination.

What is claimed is:

1. Imaging circuitry comprising:
a plurality of image pixels coupled to a pixel output line;
a first data converter circuit having an input coupled to the pixel output line and configured to output a first set of bits;
an integrator having an input coupled to the first data converter circuit; and
a second data converter circuit having an input coupled to the integrator and configured to output a second set of bits.

2. The imaging circuitry of claim 1, wherein the first data converter circuit comprises:
a capacitive digital-to-analog converter (DAC) having a plurality of capacitors and a plurality of switches;
a comparator having a first input coupled to the capacitive DAC; and
a successive-approximation-register (SAR) control logic coupled to an output of the comparator and configured to output signals for controlling the plurality of switches of the capacitive DAC.

3. The imaging circuitry of claim 2, wherein the first data converter circuit further comprises:
an autozero switch coupled between the output of the comparator and a second input of the comparator; and
a shunt capacitor coupled to the second input of the comparator.

4. The imaging circuitry of claim 2, wherein each switch in the plurality of switches is configured to operate in:

a first mode during which the switch is configured to pass through an input voltage from the pixel output line;
a second mode during which the switch is configured to pass through a first reference voltage; and
a third mode during which the switch is configured to pass through a second reference voltage different than the first reference voltage.

5. The imaging circuitry of claim 2, wherein the first data converter circuit further comprises:
an offset capacitor coupled to the plurality of capacitors, wherein the offset capacitor is smaller than a smallest capacitor in the plurality of capacitors; and
an offset switch coupled in series with the offset capacitor, wherein the offset switch is configured to operate in:
a first mode during which the switch is configured to pass through a first reference voltage; and
a second mode during which the switch is configured to pass through a second reference voltage different than the first reference voltage.

6. The imaging circuitry of claim 2, wherein the first data converter circuit further comprises:
a skip logic having an input coupled to the integrator and configured to output a corresponding skip flag to the successive-approximation-register (SAR) control logic.

7. The imaging circuitry of claim 2, wherein the integrator comprises:
an amplifier having a first input coupled to the plurality of capacitors of the capacitive DAC; and
an integration capacitor coupled to an output of the amplifier.

8. The imaging circuitry of claim 7, wherein the integrator further comprises:
an autozero switch coupled between the output of the amplifier and a second input of the amplifier; and
a shunt capacitor coupled to the second input of the amplifier.

9. The imaging circuitry of claim 7, wherein the integrator further comprises:
a null switch configured to selectively pass through a reference voltage to the first input of the amplifier.

10. The imaging circuitry of claim 7, wherein the integrator further comprises:
an integration switch coupled between the output of the amplifier and the integration capacitor; and
a reset switch configured to selectively discharge the integration capacitor.

11. The imaging circuitry of claim 1, wherein the second data converter circuit comprises:
a comparator having a first input coupled to the integrator and a second input configured to receive a ramp voltage; and
a counter controlled by the comparator and configured to output the second set of bits.

12. A method of operating imaging circuitry comprising:
with a first data converter, sampling a reset voltage;
with an integrator having an input coupled to the first data converter, generating a first integrated value during a first integration phase;
with a second data converter different than the first data converter, performing first conversion operations based on the first integrated value;
with the first data converter, sampling an image signal voltage and then performing second conversion operations to produce a coarse code; and
with the integrator, generating a second integrated value during a second integration phase.

13. The method of claim 12, further comprising:

with the second data converter, performing third conversion operations to produce a fine code; and computing a final output by shifting the coarse code, scaling the fine code based on a calibrated value, and combining the shifted coarse code with the scaled fine code.

14. The method of claim 12, wherein the first data converter comprises a successive-approximation-register (SAR) analog-to-digital converter (ADC), and wherein the integrator comprises a transconductance amplifier coupled to an integration capacitor, the method further comprising:

after sampling the reset voltage, autozeroing a comparator of the SAR ADC; and before the first integration phase, autozeroing the transconductance amplifier of the integrator.

15. The method of claim 14, further comprising:

after autozeroing the comparator of the SAR ADC, applying a reference voltage to the input of the integrator; and after performing the second conversion operations, applying the reference voltage to the input of the integrator.

16. The method of claim 14, further comprising:

after the first conversion operations and before the second integration phase, discharging or resetting the integration capacitor.

17. The method of claim 12, further comprising:

determining, based on the sampled reset voltage and the sampled image signal voltage, whether to skip at least the sampling of the image signal voltage and the second conversion operations.

18. The method of claim 12, wherein the first and second integration phases each have a duration of greater than or equal to 100 nanoseconds for mitigating thermal and flicker noise.

19. A method of operating imaging circuitry comprising:

during a vertical blanking period, performing calibration to obtain a calibrated value; and during readout:

using a first data converter to output a coarse value;

using a second data converter to output a fine value; and computing a final readout value based on the coarse value, the fine value, and the calibrated value.

20. The method of claim 19, further comprising:

with an integrator coupled between the first and second data converters, charging up an integration capacitor, wherein computing the final readout value comprises shifting the coarse value, computing a scaling factor based on the calibrated value, scaling the fine value by the scaling factor, and combining the shifted coarse value with the scaled fine value.

* * * * *